United States Patent [19]

Williams

[11] 4,413,874

[45] Nov. 8, 1983

[54] MULTIPLE CONTACT TESTING DEVICE

[76] Inventor: Robert A. Williams, 2721 White Settlement Rd., Fort Worth, Tex. 76107

[21] Appl. No.: 239,146

[22] Filed: Feb. 27, 1981

[51] Int. Cl.³ .............................................. H01R 4/48
[52] U.S. Cl. .............................. 339/151 B; 339/255 R
[58] Field of Search ......... 339/108 TP, 147 P, 149 P, 339/150 B, 151 B, 255 R; 324/73 PC, 158 P, 158 F

[56] References Cited

U.S. PATENT DOCUMENTS

| | | | |
|---|---|---|---|
| 2,691,144 | 10/1954 | Parsons et al. | 339/147 P |
| 4,179,171 | 12/1979 | Shannon | 339/255 R |
| 4,183,609 | 1/1980 | Luna | 324/158 F |
| 4,289,367 | 9/1981 | Everett | 339/150 B |
| 4,293,174 | 10/1981 | Knickerbocker | 339/255 R |
| 4,298,239 | 11/1981 | Montalto et al. | 339/255 R |

OTHER PUBLICATIONS

IBM Technical Disclosure Bulletin, Kaure et al, "Plunger Contact Assembly," vol. 18, No. 9.
IBM Technical Disclosure Bulletin, Adsmond et al, "Pin Sensor for Parts Identification," vol. 13, No. 9.

Primary Examiner—John McQuade
Assistant Examiner—Gary F. Paumen
Attorney, Agent, or Firm—Wofford, Fails & Zobal

[57] ABSTRACT

A device for testing the cables of a chaff-flare adapter of the type having a base member with a plurality of spaced contacts located inward of the surface of the base member. The device comprises a thin plate means which carries a plurality of contacts in apertures formed therein for engaging the contacts of the chaff-flare adapter. The contacts of the thin plate means are biased outward of its forward surface by coiled springs which electrically short the contacts of the device to ground. Each coiled spring has one end which tightly engages a contact of the thin plate means and an opposite end which tightly engages the rear wall of the aperture in which it is located for providing an electrical path from each contact to the rear wall of the aperture.

5 Claims, 18 Drawing Figures

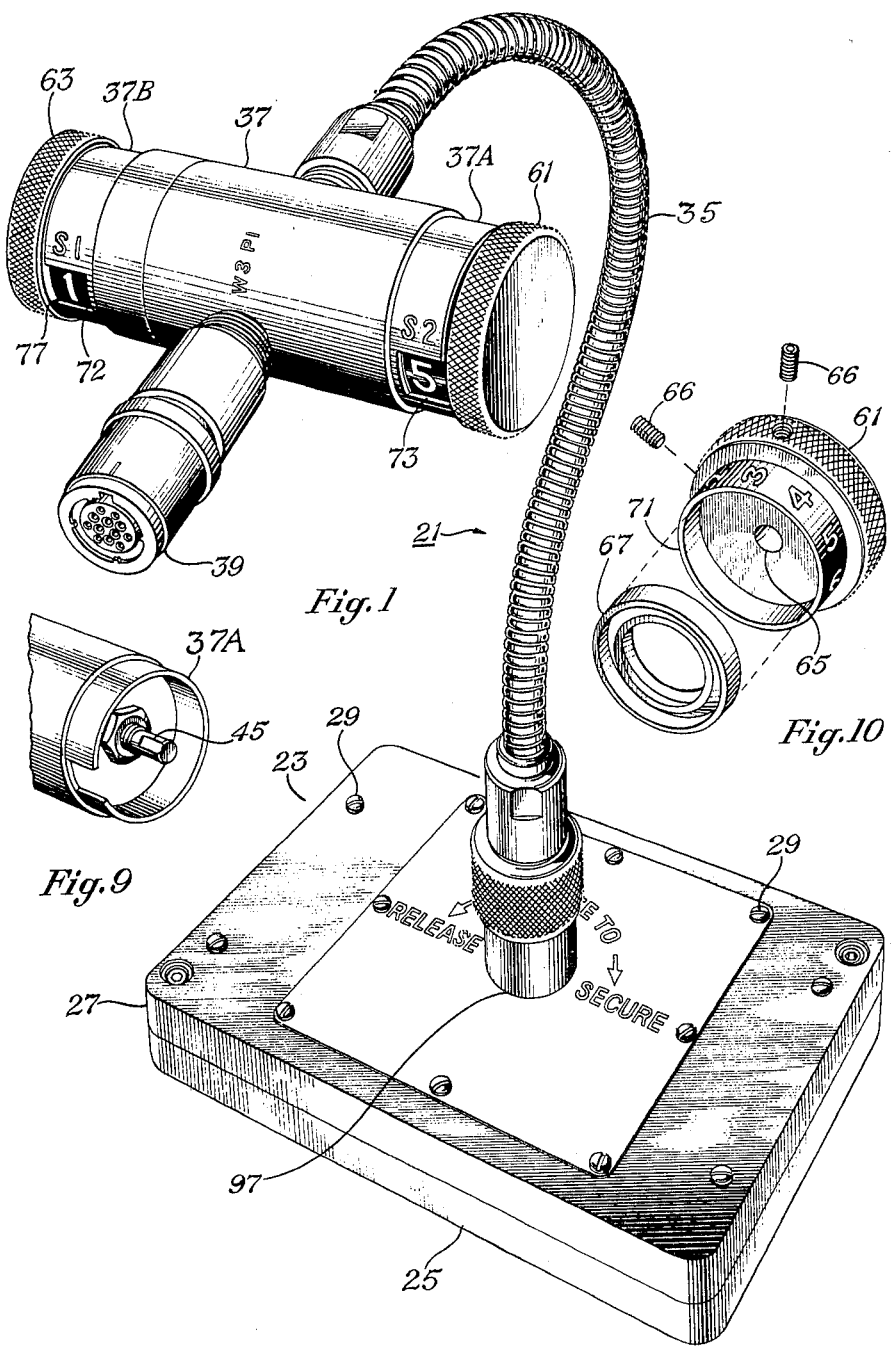

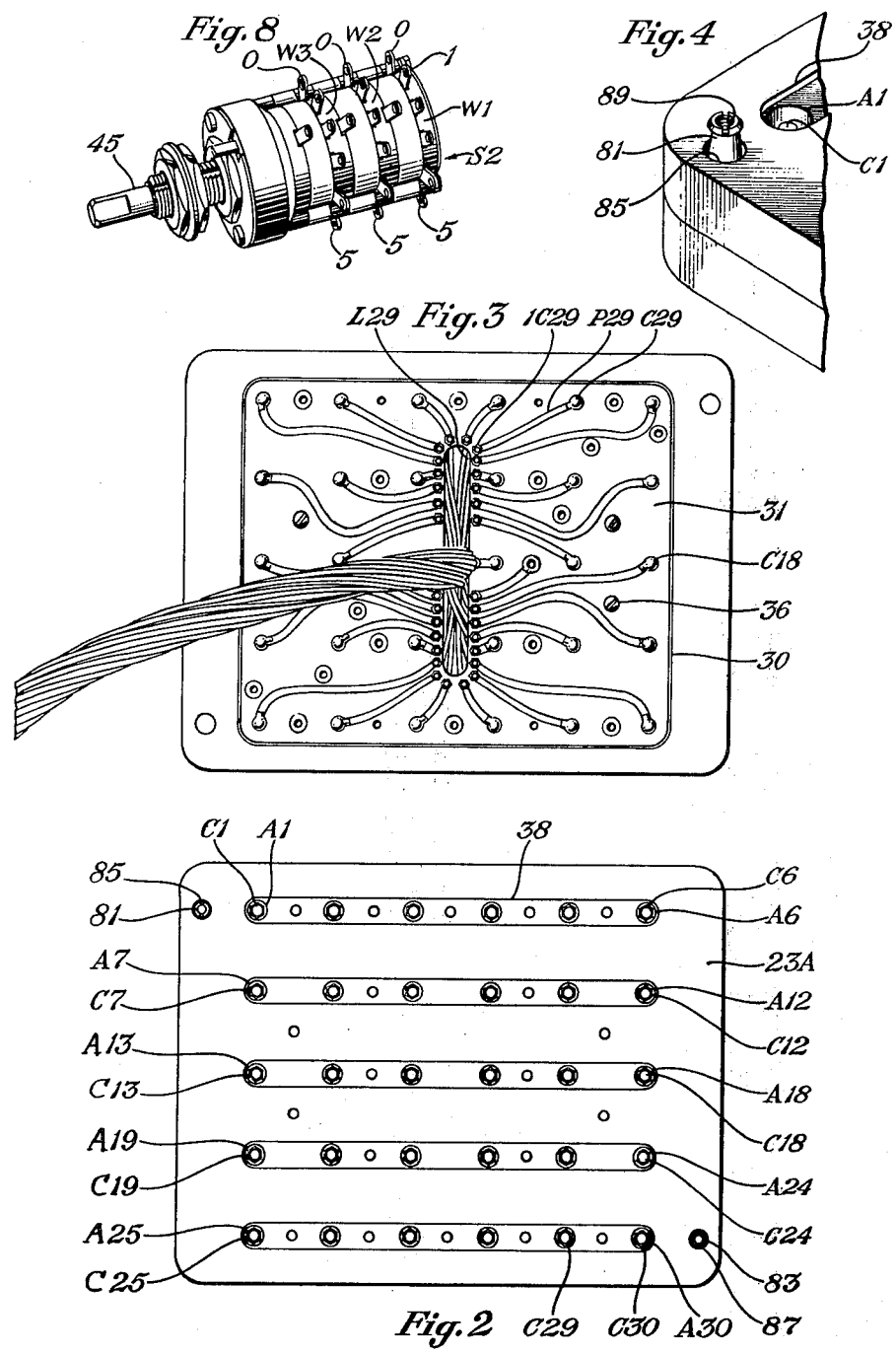

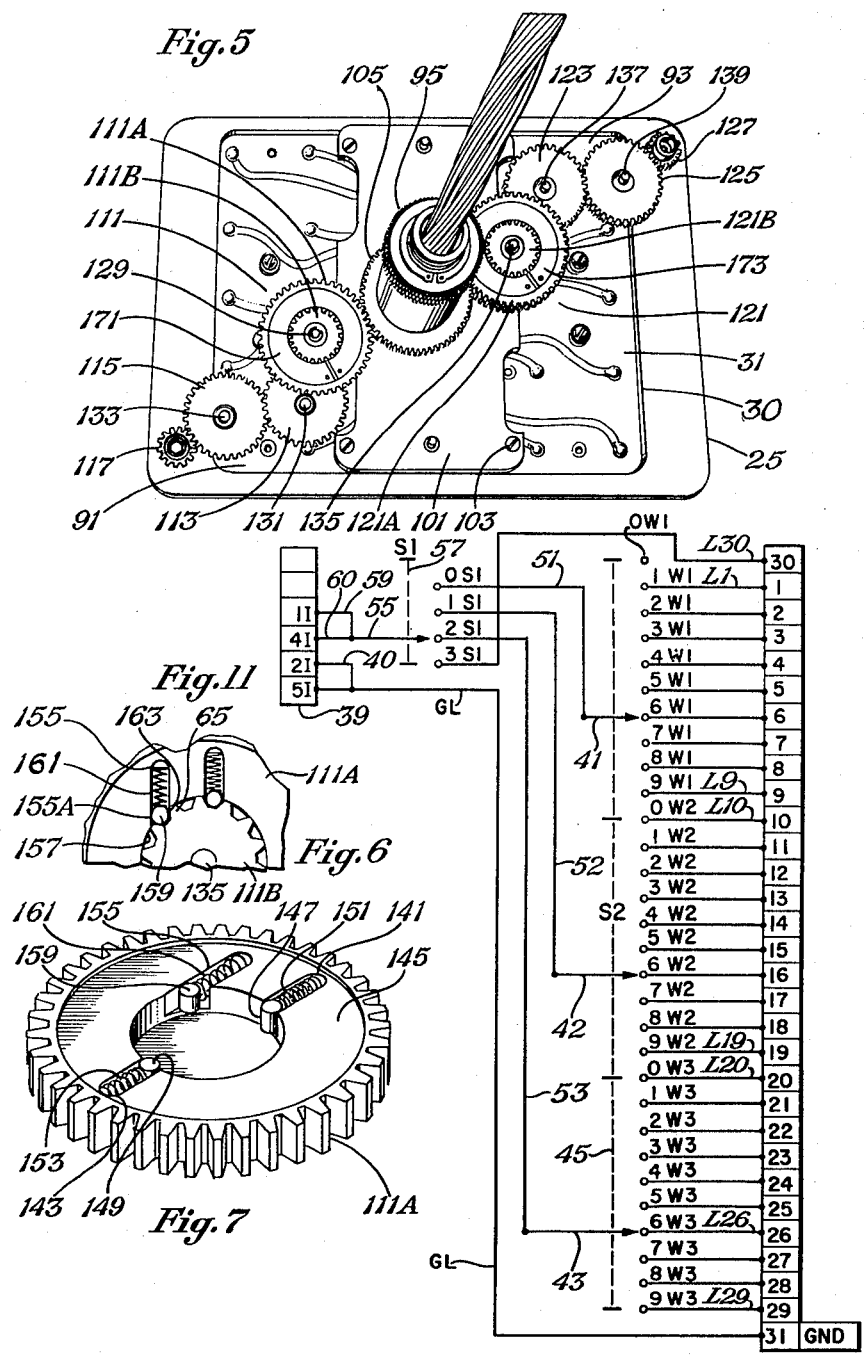

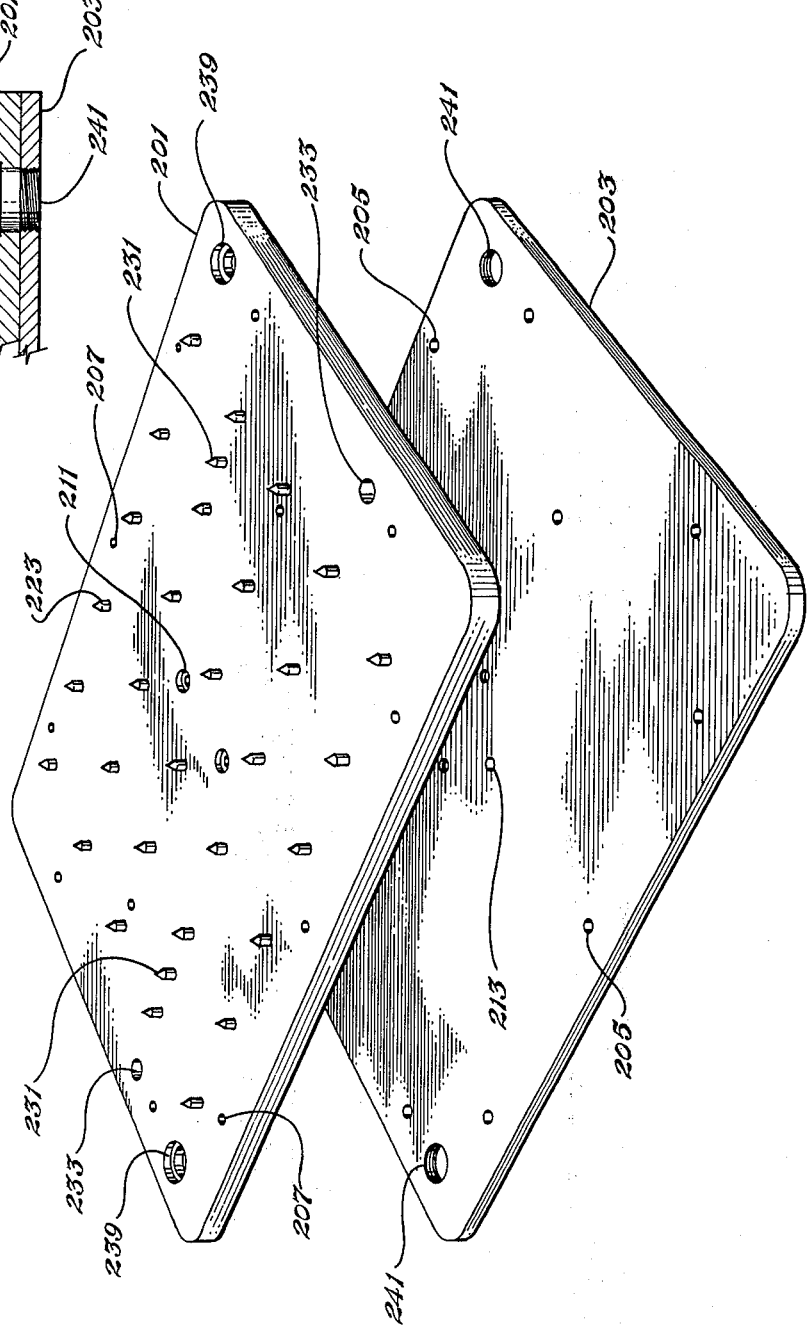

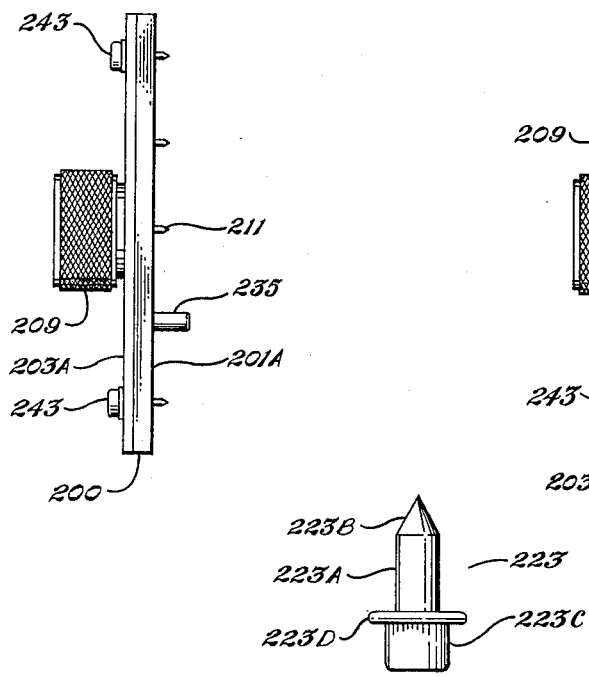
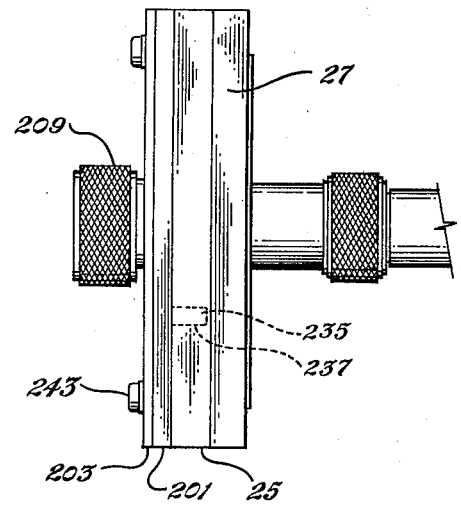
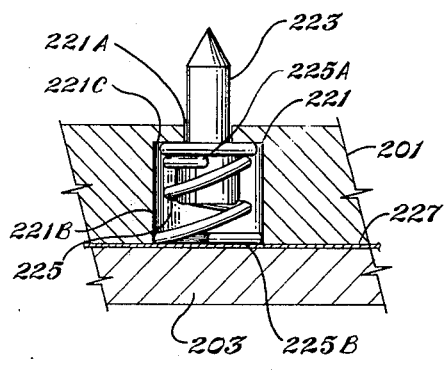
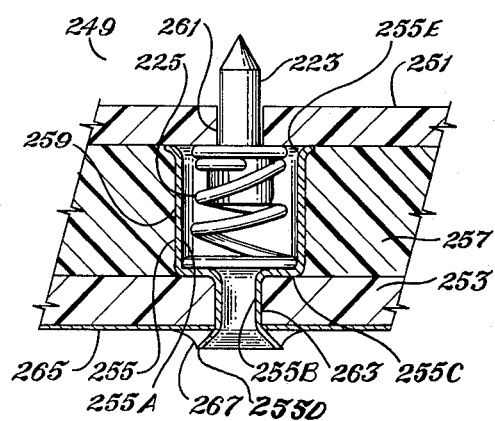

MULTIPLE CONTACT TESTING DEVICE

BACKGROUND OF THE INVENTION

1. Field of the Invention

A device for testing the cables of a chaff-flare adapter.

2. Description of the Prior Art

Currently military aircraft employ chaff-flares which are fired to confuse enemy missiles. These devices are ejected from the plane by a system which is electrically actuated. The chaff-flares are loaded in a downward facing recess formed in the plane and which has a plurality of electrical contacts for providing actuating current. Prior to loading, the fireing system and contacts must be tested to determine if sufficient current is obtainable when the firing system is on and if no current is present on the contacts when the firing system is off.

Devices are employed for carrying out these tests, however, installation and removal of the prior devices is time consuming. For installation, the prior devices must be fitted up into the recess and secured with threaded members individually tightened with a hex wrench. For removal, the procedure is reversed. As can be understood, installation and removal can be a very tedious operation particularly in cold weather when one is required to wear gloves.

U.S. patent application Ser. No. 30,454, now U.S. Pat. No. 4,284,315, discloses and claims a new and useful apparatus for testing a chaff-flare firing system which avoids the above problems.

SUMMARY OF THE INVENTION

It is an object of the present invention to provide a new, compact and reliable device for testing the components of a device of the type disclosed in U.S. patent application Ser. No. 30,454, now U.S. Pat. No. 4,284,315.

It is a further object of the present invention to provide a device for electrically contacting a plurality of spaced contact means located inward of the surface of a base member. The device comprises plate means which carries a plurality of contacts in apertures formed therein for engaging the contact means of the base member. The contacts of said plate means are biased outward of its forward surface by coiled springs. Each coiled spring has one end which tightly engages a contact of said plate means and an opposite end which tightly engages the wall of the aperture in which it is located in order to provide an electrical path from said contact to said wall.

BRIEF DESCRIPTION OF THE DRAWINGS

FIG. 1 is a perspective view of the adapter of U.S. patent application Ser. No. 30,454, now U.S. Pat. No. 4,284,315.

FIG. 2 is a plan view of the contact side of the base of the adapter of FIG. 1 illustrating a plurality of electrical contacts.

FIG. 3 is an electrically insulated circuit board located within the base of the adapter of FIG. 1 and which carries the contacts shown in FIG. 2.

FIG. 4 illustrates in detail one of the two attaching members shown in FIG. 2.

FIG. 5 illustrates the two drive means located in the base of the adapter of FIG. 1 employed for rotating the two attaching members for threading and unthreading purposes.

FIG. 6 illustrates the slip and locking mechanism of one of the drive means of FIG. 5.

FIG. 7 is a perspective view of the complete outer gear of FIG. 6.

FIG. 8 is a perspective view of a rotary switch employed in the switching system of the adapter of FIG. 1.

FIG. 9 illustrates a portion of the switch of FIG. 8 located in its housing.

FIG. 10 illustrates one of the switching knobs of FIG. 1 in a disassembled position.

FIG. 11 is an electrical schematic diagram of the switching system employed in the adapter of FIG. 1.

FIG. 12 is an exploded view of the device of the present invention.

FIG. 13 is a side view of the device of FIG. 12.

FIG. 14 is a side view of the device of FIGS. 12 and 13 coupled to the base of the adapter of FIG. 1 for testing purposes.

FIG. 15 is a side view of one of the contacts of the device of FIGS. 12 and 13.

FIG. 16 is a partial cross-sectional view of a contact of the type shown in FIG. 15 located in an aperture of the device of FIGS. 12 and 13.

FIG. 17 illustrates a fastener to which a fastener on the base of the adapter of FIG. 1 may be fastened for securing the device of FIGS. 12 and 13 to the base of the adapter of FIG. 1.

FIG. 18 is another embodiment of the present invention.

CHAFF-FLARE ADAPTER

Referring now to FIGS. 1-3 of the drawings, the adapter disclosed in U.S. patent application Ser. No. 30,454 is identified at 21. It comprises a base 23 formed of two metal plates 25 and 27 which are secured together by bolts 29. Plate 25 has a cavity 30 for holding an electrically insulating circuit board 31 and plate 27 has a cavity (not shwn) for receiving the gear drive mechanism of FIG. 5. The other side of the circuit board 31 has secured thereto 30 electrical contacts C1'C30 which are shown in FIG. 2. These contacts extend through apertures A1-A30 respectively formed through base plate 25 when the circuit board is fitted into cavity 30. The circuit board is secured in the cavity 30 by bolts 36. As shown in FIG. 2, the apertures A1-A30 are large enough such that the contacts do nt engage their walls. The apertures A1-A30 are formed in rows and open into grooves 38 formed in the surface of the contact side 23A of the base 23. The ends of the contacts C1-C30 are spaced inward from the flat surface of the contact side 23A of the base 23 and inward from the inward surface of the grooves 38.

The contacts C1-C30 extend through the circuit board and on the side shown in FIG. 3, a printed circuit extends from each contact to the center when it is connected to an electrical lead. For example, printed circuit P29 extends from contact C29 to an inward contact IC29 which is connected to electrical lead L29. All of the leads extend in a bundle through a flexible conduit 35 to a housing 37 which houses the rotary switch S2 of FIG. 8. Each of the leads of the bundle except for the ground lead GL (See FIG. 11) and lead L30 from contact C30 is connected to one of the ten contacts of one of the three wafers W1-W3 of the switch S2.

Referring also to FIG. 11, the thirty contacts C1-C30 are identified as blocks 1-30 respectively and the ten contacts of each of the three wafers W1-W3 are identified as 0W1-9W1, 0W2-9W2, and 0W3-9W3 respectively. In FIG. 11, the printed circuits on the circuit board 31 are not illustrated Leads L1-L9 are shown extending directly from blocks 1-9 to contacts 1W1-1W9 of wafer W1; leads L10-L19 are shown extending directly from blocks 10-19 to contacts 0W2-9W2 of wafer W2; and leads L20-L29 are shown extending directly from blocks 20-29 to contacts 0W3-9W3 of wafer W3. Contact 0W1 of wafer W1 has no fixed electrical lead connected thereto. Lead L30 extends from block 30 to contact 3S1 of a second rotary switch S1 located in the housing 37. Ground lead GL extends from block 31 (which identifies a ground connection) to contact 5I which is a female receptacle of an indicator connector 39. Lead 40 is connected from ground lead Gl to female receptacle 2I of indicator 39.

The ten contacts 0W1-9W1, 0W2-9W2, and 0W3-9W3 of each of wafers W1, W2, W3 respectively of switch S2 are arranged in a circle for sequential engagement by a rotatable wiper contact associated with each wafer. In FIG. 11, the rotatable wiper contacts for the wafers W1, W2, W3 are identified at 41, 42, and 43 respectively. These wiper contacts are fixedly connected to a rotatable shaft 45 such that rotation of the shaft rotates all of the three wiper contacts 41-43 simultaneously. The wiper contacts 41-43 are located with respect to each such that they engage corresponding contacts of their wafers at the same time. For example, when wiper contact 41 engages wafer contact 6W1, wiper contacts 42 and 43 engage wafer contacts 6W2 and 6W3 respectively. In FIG. 11, the rotary shaft 45 is represented by dotted line 45.

Wiper contacts 41, 42, and 43 are connected by leads 51, 52, and 53 respectively to contacts 0S1, 1S1, and 2S1 of rotary switch S1. Contacts 0S1, 1S1, 2S1, and 3S1 are carried by a single wafer and are arranged in a circle for sequential engagement by a rotatable wiper contact 55 when it is rotated by a rotatable shaft represented by dotted line 57. Wiper contact 55 is connected by way of leads 59 and 60 to female receptacles 1I and 4I of connector 39.

Shafts 45 and 57 are rotated separately by knobs 61 and 63 extending out of opposite ends of housing 37. The shafts are located in axial apertures formed in the knobs and fixedly held to the knobs by set screws. In FIG, 10, the axial aperture of knob 61 is identified at 65 and the set screws which fixedly hold the knob to the shaft 45 are identified at 66. Member 67 is an annular plastic seal which fits within rim 71 of the knob 61 to form a water tight seal between the knob 61 and the inside of housing 37. A similar annular seal (not shown) is located within the rim 72 of knob 63.

The rim 71 of knob 61 has numbers 1-10 formed at equally spaced positions around its outside for viewing through a window 73 formed through the end 37A of housing 37. The knob 61 can be rotated 360° to present any of its ten numbers for viewing through the window 73. Knob 61 is connected to shaft 45 such that when either of its number 0-9 on its rim 71 appears through window 73, the wiper contacts 41-43 engage the corresponding wafer contacts of switch S2. For example, if the number 6 appears in window 73, the wiper contacts 41-43 will engage wafer contacts 6W1, 6W2, and 6W3.

The rim 72 of knob 63 has spaced numbers 0-3 formed around its outside within an arc of about 45° for viewing through window 77 formed through end 37B of housing 37. Stops (not shown) are formed on rim 72 and within the housing end 73B such that knob 63 may be rotated only over an angular path (about 45°) sufficient to present only its numbers 0-3 for viewing through window 77. Knob 63 is connected to shaft 57 such that when either of its number 0-3 on its rim 72 appears through window 77, the wiper contact 55 will engage the corresponding wafer contact of switch S1. For example, if number 1 appears through window 77, contact 55 will engage wafer contact 1S1.

The knobs 61 and 63, their numbers on their rims, and the two rotary switches S1 and S2 connected as shown in FIG. 11, allows the operator to rapidly dial any of the contacts C1–C30 for connection to the female receptacles 1I and 4I of connector 39 for tests purposes. For example, by dialing number 6 with knobs 61 and number 2 with knob 63, contact C26 (block 26 of FIG. 11) will be connected to female receptacle 1I and 4I of connector 39. In this position of the knobs 61 and 63, wiper contacts 41, 42 and 43 will engage wafer contacts 6W1, 6W2, and 6W3, however, wiper contact 55 will engage wafer contact 2S1 only. Thus contact C26 will be connected to female receptacles 1I and 4I by way of lead L26 wiper contact 43, lead 53, wafer contact 2S1, wiper contact 55, and leads 59 and 60. If the number 3 is dialed by knob 63 and the number 9 is dialed by knob 61, contact C30 will be connected to female receptacles 1I and 4I by way of lead L30, wafer contact 3S1, wiper contact 55, and leads 59 and 60.

Thus wafer contacts 0W1-9W1, 0W2-9W2, and 0W3-9W3 represent the decimal digits 0-9 respectively and contacts 0S1-3S1 represent the decimal digits 0-3 weighted by a factor of 10. By dialing with knob 63 any of the contacts 0S1-3S1 and either of the decimal digits 0-9 with knob 61, any of the contacts C1-C30 can be connected to the indicator for test purposes.

The quick dialing arrangement as described is very useful for testing all of the contacts of the chaff-flare firing mechanism particularly in cold weather when the operator is required to wear gloves. The testing operations are carried as follows. An indicator (not shown) is connected to either of receptacles 1I or 4I and to either of receptacles 2I or 5I. Prior to loading of the chaff-flares, the base 23 of the adapter 23 with its contact side 23A forward is fitted into the recess formed in the aircraft to receive the chaff-flares. A quick connect-disconnect apparatus, which will be described subsequently, is operated to connect the base 23 to the housing of the firing system. When the base 23 is properly connected to the housing of the firing system, its contact side 23A will engage the housing of the firing system and its thirty contacts C1-C30 will engage the thirty contacts respectively of the firing system. Engagement of the base 23 with the housing of the firing system forms the ground connection which is identified as block 31 in FIG. 11. With the firing system on, the knobs 61 and 63 will be operated to sequentially connect each of the contacts C1-C30 and hence each of the thirty contacts of the firing system to the indicator to determine whether there is sufficient firing current on the contacts. The sequential tests are then repeated with the firing system off to insure that there is no current on the contacts of the firing system when it is in the off condition. The quick connect-disconnect mechanism then is operated to release the base and remove it from the recess whereby the chaff-flares may be loaded in place.

Referring now to FIGS. 2,4, and 5–7, the quick connect-disconnect apparatus will be described. This apparatus comprises two hollow members 81 and 83 extending through apertures 85 and 87 formed thru plate 25 and beyond the contact side 23A of base 23. Members 81 and 83 are rotatably supported by the base and have internal threads 89 whereby they may be threaded to two threaded male members extending from the housing of the firing system. The members 81 and 83 may be rotated in opposite directions by two drive means 91 and 93 and a rotatable knob 95. The drive means 91 and 93 and the lower portion of the knob 95 are located between plates 25 and 27 in a cavity formed in plate 27 and the upper portion of knob 95 extends through an aperture 97 formed through plate 27 whereby it may be rotated by hand. Each drive means 91 and 93 is constructed such that if it's associated threaded member 81 or 83 is threaded to a tightened position before the other, it will slip allowing the knob 95 to continue to be rotated for threading the other threaded member to a tightened position. During unthreading, neither drive means 91 or 93 will slip.

Knob 95 has its lower end 95A rotatably located in an aperture (not shown) formed through a plate 101 which is secured to plate 25 by bolts 103. An electrically insulated sheet (not shown) is located between plate 101 and the circuit board 31. Fixedly attached to the lower end 95A of knob 95 above the plate 101 is a gear 105 which drives drive means 91 and 93 when the knob 95 is rotated. Drive means 91 comprises gear means 111 and gears 113, 115 and 117, the later of which is attached to threaded member 81. Drive means 93 comprises gear means 121 and gears 123, 125, and 127, the later of which is attached to threaded member 83.

Referring also to FIGS. 6 and 7, gear means 111 comprises an outer gear 111A whose teeth mesh with those of gear 105, and an inner concentric gear 111B. The axial dimension of gear 111B is greater than that of gear 111A and its lower portion extends below gear 111A whereby its teeth mesh with the teeth of gear 113. The teeth of gear 113 also mesh with the teeth of gear 115 whose teeth also mesh with those of gear 117. Gears 111B, 113, and 115, are supported for rotation by pins 129, 131, and 133 respectively which are secured to plate 25.

Similarly, gear means 121 comprises an outer gear 121A, whose teeth mesh with those of gear 105, and an inner concentric gear 121B. The axial dimension of gear 121B is greater than that of gear 121A and it's lower portion extends below gear 121A whereby its teeth mesh with the teeth of gear 123. The teeth of gear 123 also mesh with the teeth of gear 125 whose teeth also mesh with those of gear 127. Gears 121B, 123, and 125 are supported for rotation by pins 135, 137, and 139 respectively which are secured to plate 25.

In operation, when knob 95 and hence gear 105 are rotated clockwise, the gears are driven to rotate gears 117 and 127 and their threaded members 81 and 83 clockwise whereby they may be threaded to the two threaded male members of the firing system for connecting the base thereto. In the connected position, the contacts C1–C30 separately engage the thirty contacts of the firing system. Rotation of the knob 95 counterclockwise rotates gears 117 and 127 and hence threaded members 81 and 83 counterclockwise for unthreading purposes for releasing the base 23 from the firing system.

During the connecting process, if member 81 is threaded to a tightened position before member 83, gear 111A will slip relative to gear 111B thereby allowing knob 95 to continue to be rotated whereby member 83 may be threaded to a tightened position also. Similarly, if member 83 is threaded to a tightened position before member 81, gear 121A will slip relative to the gear 121B thereby allowing knob 95 to continue to be rotated whereby member 81 may be threaded to a tightened position. During the unthreading process, neither of gears 111A or 121A will slip relative to their inner gears 111B and 121B.

Since gear means 111 and 121 are identical, only gear means 111 will be described in detail. As seen in FIGS. 6 and 7, outer gear 111A has two opposite radial slots 141 and 143 formed in side 145. Slidably located in slots 141 and 143 are cylindrical pins 147 and 149 which are urged inward by springs 151 and 153. A third slot 155 parallel to slot 141 is formed in side 145 of gear 111A at a point nearly tangent to the inner wall 157 of gear 111A. Slidably located in slot 155 is a cylindrical pin 159 which is urged inward by spring 161. The diameters of pins 147, 149, and 159 are such that the pins will fit partially in the space between adjacent teeth of gear 111B when the spaces are aligned with slots 141, 143, and 155 as shown in FIG. 6. During the threading operation, knob 95 and hence gear 105 will be rotated clockwise whereby gear 111A will be rotated counterclockwise. As long as there is no large amount of force between gears 111A and 111B, springs 151 and 153 will hold pins 147 and 149 partially in the space between adjacent teeth of the gear 111B and partially in their slots 141 and 143 as shown in FIGS. 6 and 7 whereby gear 111B also will be rotated counterclockwise thereby driving gears 113, 115 and 117 in a manner to thread member 81 to the threaded male member to the firing system. When member 81 is threaded to a tightened position, gears 117, 113, and 111B will become stationary and as additional counterclockwise force is applied to gear 111A, the pins 147, 149, and 159 will follow the surfaces of the next teeth of gear 111B outward into their slots 141, 143, and 155 respectively. Thus the pins 147, 149, and 159 will be moved completely into their slots whereby gear 111A may rotate or slip relative to gear 111B. Upon continued rotation of gear 111A, the pins will be moved inward by their springs into the next spaces between the teeth of gear 111B and then outward into their slots, etc., allowing gear 111A to rotate relative to gear 111B. Gears 121A and 121B operate in the same manner. This feature allows both members 81 and 83 to be threaded to a tightened position. For example if member 81 is threaded to a tightened position before member 83, gear 111A will begin to slip allowing knob 95 to continue to be rotated to thread member 83 to a tightened position.

When knob 95 is rotated counterclockwise to unthread members 81 and 83, neither of gears 111A and 121A will slip. This insures that members 81 and 83 will be unthreaded from tightened positions. Referring again to FIG. 6, when knob 95 is rotated counterclockwise, gear 111A will be rotated clockwise. Assume that pin 159 is in the space between the two gear teeth as shown. Upon the application of a clockwise force to gear 111A the forces between gears 111A and 111B will hold or lock pin 159 between the wall portion 155A of slot 155 and the opposite surface 163 of tooth 165. Thus pin 159 will not be moved into slot 155 whereby gear 111A will not slip relative to gear 111B if a clockwise rotational force is applied to gear 111A. Thus gear 111B will rotate clockwise with gear 111A to unthread member 81 regardless of how tight it is threaded to the male threaded member of the firing system. Due to the radial positions of slots 141 and 143, their pins 147 and 149 do not act to lock gear 111B to gear 111A upon the application of a clockwise force to gear 111A. Gears 121A and 121B operate in the same manner. Cover plates 171 and 173 are secured to the gears 111A and 121A to hold their pins and springs in their slots.

Thus as can be understood, the quick connect-disconnect apparatus allows the base 23 of the adapter to be rapidly and effectively connected to the firing system for test purposes by simply rotating the knob 95 in a clockwise direction. The base may be rapidly disconnected by rotating the knob 95 in a counterclockwise direction.

The base 23 is capable of holding two additional gears drive means and two additional threaded members if required.

In one embodiment, the rotary switch S2 is of the type manufactured by Grayhill, Inc., La Grange, Ill. 60525 and shown in their Engineering Catalog G-374A, pages 38-44, copyright 1974.

The drive means 91 and 93 may be modified to employ belts for rotating members 81 and 83 instead of the gear trains shown and described. In this modification, gears 105, 113, 115, 123, and 125 will be eliminated. The lower end 95A of knob 95 will have a smaller diameter and gear 111B will be modified to be annular in shape having an inside diameter sufficient to receive the lower end 95A of knob 95. Gear 111B will be fixedly connected around end portion 95A at one level with gear 111A located around gear 111B. Gear 111A will have the same slots, pins, and springs as shown in FIGS. 6 and 7. A flexible belt with inner teeth will extend around gears 111A and 117 for driving gear 117 and hence member 81 when knob 95 is rotated. Gear 121B also will be modified to be annular in shape having an inside diameter sufficient to receive the lower end 95A of knob 95. Gear 121B will be fixedly connected around end portion 95A at a level different from that of gear 111B. Gear 121A will be located around gear 121B and will have the same slots, pins, and springs as gear 111A as shown in FIGS. 6 and 7. A flexible belt with inner teeth will extend around gears 121A and 127 for driving gear 127 and hence member 83 when knob 95 is rotated.

When knob 95 is rotated clockwise, modified gears 111B and 121B will be directly rotated clockwise which in turn will rotate clockwise gears 111A and 121A, their belts, and gears 117 and 127 and hence members 81 and 83. Counterclockwise rotation of knob 95 results in counterclockwise rotation of gears 111B and 121B, gears 111A and 121A, their belts, gears 117 and 127 and hence members 81 and 83. During the threading operations, pins 147 and 149 will biased by their springs partially into the spaces between adjacent teeth of 111B and 121B which will cause gears 111A and 121A to be rotated clockwise with gears 111B and 121B respectively. If member 81 becomes tightened before member 83, gear 111B will begin to slip or rotate relative to gear 111A thereby allowing knob 95 to continue to be rotated to thread member 83 to a tightened position. Similarly, if member 83 becomes tightened before member 81, gear 121B will begin to slip or rotate relative to gear 121A thereby allowing knob 95 to continue to be rotated to thread member 81 to a tightened position.

When knob 95 is rotated in a counterclockwise direction to unthread members 81 and 83, pins 159 of gears 111A and 121A will lock gears 111A and 121A to gears 111B and 121B respectively preventing slipage between gears 111A and 111B and 121A and 121B.

In the event that the chaff-flare firing system has ten or less contacts, a corresponding number of contacts will be carried by the base 23 and located to engage the firing system contacts when the base 23 is locked in place for test purposes. Only one of the wafers W1-W3 of switch S2 will be employed and switch S1 will be eliminated. For example, assume that the firing system has only ten contacts. Base 23 may be modified to carry only contacts C1-C9 and C30 appropriately located to engage the ten contacts of the firing system. Lead L30 will be connected to contact 0W1. Contacts 0W2-9W2 and 0W3-9W3 and wiper contacts 42 and 43 will not be employed. As indicated above, switch S1 will be eliminated and lead 51 of wiper contact 41 will be connected directly to leads 59 and 60. Rim 71 of knob 61 will be modified to change its 0 number to 10. When any of numbers 1-10 are dialed through window 73, wiper contact 41 will engage the corresponding contact 0W1-9W1 for connecting either of contacts C30, C1-C9 respectively to female receptacles 1I and 4I.

DESCRIPTION OF THE PREFERRED EMBODIMENT

Referring now to FIGS. 12-17, the testing device of the present invention will be described. It is employed for testing the leads and connection of the chaff-flare adapter of FIGS. 1-11. The device is identified by reference numeral 200 and comprises a forward plate 201 and a rear plate 203 secured together by bolts, not shown, but which extend through holes 205 formed through rear plate 203 and are screwed into threaded holes 207 formed in forward plate 201. The bolts are inserted into holes 205 from the rear side 203A of plate 203. A knob 209 for holding the device is secured to the back side of the device by way of bolts not shown but which extend through apertures 211 and 213 formed through plates 201 and 203.

The forward plate 201 has a plurality of contact apertures 221 formed therethrough for receiving contacts 223. Each contact 223 has a small diametered forward portion 223A which has a pointed end 223B, a larger diametered rear portion 223C with an enlarged round flange 223D between forward and rear portions 223A and 223C. Each aperture 221 comprises a small diametered portion 221A which extends through forward surface 201A and a large diametered portion 221B which extends rearward of portion 221A. When the contact 223 is fitted in aperture 221, forward portion 223A extends through aperture portion 221A and the flange 223D and rear portion 223C are located in enlarged aperture portion 221B. The large diametered portion 221B of the aperture 223 is long enough to allow the contact 223 to move rearward and forward in its aperture 221. A coiled spring 225 is located in the aperture 221. It has a forward end 225A tightly fitted around contact portion 223C and a rear end 225B which tightly engages the rear side wall of aperture portion 221B and is seated against plate 203 or against a metal layer 227 inserted between plates 201 and 203. The coiled spring 225 urges the contact 223 forward with the flange 223D engaging the shoulder 221C formed between aperture portions 221A and 221B.

In testing the adapter of FIGS. 1-11, the device 200 will be secured to the base member 23 of the adapter such that the forward surface 201A of device 200 engages surface 23A of base member 23. For testing the specific adapter shown in FIGS. 1-11, the device 200 will have 30 contacts 223 located such that when its forward surface 201A engages surface 23A of base member 23 the 30 contacts 223 will be aligned with and engage the 30 contacts C1-C30 of base member 23. In this position, the contacts 223 will be pushed back into their apertures 221 a small amount against their coiled springs insuring good electrical contact between the contacts C1-C30 and contacts 223.

The device 200 also has two ground contacts 231 which are similar to contacts 223 and are located in apertures similar to apertures 221 formed through plate 201. A coiled spring similar to spring 225 is located in each of the apertures, tightly engaging the rear of the contacts 231 and the plate 203 or layer 227 if employed. The forward portions of ground contacts 231 may be shorter than forward portions 223A of contacts 223 and will engage the surface 23A of base member 23 when the device 200 is secured to base member 23 as shown in FIG. 14 for establishing a ground connection between the device 200 and base member 23.

In one embodiment, plates 201 and 203 may be formed of an electrically conductive material such as an aluminum alloy. In this embodiment, layer 227 will not be employed and ends 225B of coiled springs 225 will seat against plate 203. Plates 25 and 27 of base member 23 also will be formed of an electrically conductive metal. Contacts 223 and 231 may be formed of steel and coiled springs 225 formed of an electrically conductive metal such as a beryllium-copper alloy.

Thus when the device 200 is secured to the base member 23, the coiled springs 225 will provide electrical flow paths from the contacts 223 to the plate 203. The contacts 231 and their springs 225 will provide electrical flow paths between surface 23A of base member 23 and plate 203. Since the contacts 223 will engage contacts C1-C30; the plates 201 and 203 engage each other; and ground contacts 231 will engage the surface 23A of base member 23, the contacts C1-C30 will be shorted to ground. Each contact C1-C30 of the adapter can be selected with the selector switch 51, 52 for testing purposes. If the tests show that each of the contents C1-C30 is shorted to ground, then one will know that the leads and electrical connections between the contacts C1-C30 and the selector switch 51, 52 are satisfactory. If, however, the tests show that one or more of the contacts C1-C30 are not shorted to ground, then one will know that problems exist in the leads or electrical connections between the contacts C1-C30 and the selector switch 51, 52.

In a further embodiment, the plate 203 may be formed of a non-conducting material such as a hard anodized aluminum alloy. In this embodiment an electrically conducting metal layer or plate 227 will be employed between plates 201 and 203.

The use of the device 200 for testing the chaff-flare adapter of FIGS. 1-11 has advantages in that it is reliable and allows the plates 201 and 203 to have a small thickness. In one embodiment, plate 201 may have a thickness of 0.250 of an inch and plate 203 may have a thickness of 0.125 of an inch.

Referring to FIG. 12, holes 233 formed through plate 201 hold dowels, 235 as shown in FIGS. 13 and 14 for guiding the surface 201A of device 200 into proper engagement with surface 23A of base member 23 to ensure engagement of contacts 223 with contacts C1-C30. The base member 23 has holes 237 formed therein for receiving the dowels 235.

Referring to FIG. 12 and 17, plates 201 and 203 have holes 239 and 241 for receiving fastening members 243. Each of the members 243 has an aperture formed in its end 243A in which is secured a central threaded male member. The members 81 of base member 23 are threaded to the central male threaded members of members 243 for securing the device 200 to the base member 23 for test purposes.

Referring to FIG. 18 there is illustrated a firing system 249 employing the contacts 223 and coiled springs 225 for firing the chaff-flares of a military aircraft. The system of this embodiment comprises forward and rear plates 251 and 253 separated by a plurality of spaced housing members 255, only one of which is shown. The contacts 223 and coiled springs 225 of this embodiment are the same as described in connection with the device of FIGS. 11-17. Each housing member 255 carries a contact 223 and a coiled spring 225. The number of housing members 255 and hence the number of contacts 223 will correspond with the number of contacts of the chaff-flares to be fired. The housing members 255 and hence the contacts 223 will be positioned such that the contacts 223 will engage all of the contacts of the chaff-flares respectively when the device 249 is brought into firing position. A suitable ground contact will be employed in this embodiment.

Plates 251 and 253 are formed of material such as epoxy fibre glass that does not conduct electrical current. An electrical non-conducting layer 257 having apertures 259 for receiving the housing members 255 may be located between plates 251 and 253 although such a layer is not necessary. The plate 251 has a plurality of small diametered apertures 261 for freely receiving the forward portions 223A of the contacts 223. The housing members 255 each has a large diametered opening 255A for receiving the rearward end 223C and flange 223D of its contact and for receiving its coiled spring 255. The housing members 255 are formed of an electrically conductive metal. The rear end of each housing member 255 has a small diametered portion 255B which is fitted into an aperture 263 formed through plate 253. A shoulder 255C separates portion 255A from portion 255B.

In assembling the device 249, the rear portion 255B of each of the housings 255 is inserted into its aperture 263 with its rear end extending beyond the rear side of plate 253. The rear end of each of the housings 255 is flared out at 255D for example by swaging to secure the housing 255 to the plate 253. An electrically conductive layer 265 is formed on the rear side of plate 253 and is electrically connected to all of the flared portions 255D of housings 255 by solder 267. The coiled springs 225 and contacts 223 then are inserted into the housings 255 through their open ends 255E. The forward end of the coiled spring 225A tightly engages the rear end 223C of the contact 223 and the rear end 225B of the coiled spring 255 tightly engages the side wall of the housing portion 255A at its rear and is seated against the shoulder 255C. The plate 251 is located in place as shown and the two plates 251 and 253 are secured together by bolts (not shown), with the housing members 255 located between the plates and the contacts 223 and coiled springs 225 located in the housing members with the forward ends 223A of the contacts extending through apertures 261. Thus an electrical flow path is provided between each of the contacts 223 and layer 265 by way of springs 225 and housing members 255. Firing of the chaff-flares is carried out by applying current to layer 265. The annulus between contact portions 223A and apertures 261 will be sufficient to allow passages of heat, smoke, etc. upon firing of the chaff-flares.

I claim:

1. A device for electrically contacting a plurality of spaced contact means located inward of the surface of a base member, comprising:

first and second plates secured together, said first plate having an outward facing forward surface, said first and second plates being formed of electrically conductive material, a plurality of spaced apart apertures formed through said first plate, each aperture comprising a small portion extending through said forward surface of said first plate and an enlarged portion extending rearward from said small portion with a shoulder formed between said small portion and said enlarged portion, said enlarged portion of each aperture having side wall means extending rearward from said shoulder to a rear wall formed by said second plate, an electrical contact located partially in each of said apertures, each contact having a forward end portion and a rear end portion with said forward end portion extending through said small portion of its associated aperture and beyond said forward surface of said first plate and with said rear end portion located in said enlarged portion of its associated aperture, said rear end portion of each contact having a diameter greater than that of its forward end portion, said rear end portion of each contact having means adapted to engage said shoulder of its associated aperture.

said enlarged portion of each of said apertures having a length sufficient to allow said rear end portion of its associated contact to move rearward and forward therein, when said means of said rear end portion of each contact engages said shoulder of its associated aperture, said rear end portion of said contact is spaced from said rear wall of its associated aperture, an electrically conductive coiled spring located in each enlarged portion of said apertures for urging said means of said rear end portion of its associated contact toward said shoulder and said forward end portion of its associated contact beyond said forward surface of said first plate, each coiled spring having a forward end surrounding and tightly engaging said rear end portion of its associated contact and a rear end seated against said rear wall of said enlarged portion of its associated aperture and tightly engaging said side wall means of said enlarged portion of its associated aperture.

2. A device for electrically contacting a plurality of spaced contact means located inward of the surface of a base member, comprising:

plate means comprising first and second plates secured together, said first and second plates being formed of electrically conductive material, said first plate having a forward surface, a plurality of spaced apart apertures formed in said first plate and extending through said forward surface of said first plate, each aperture comprising a small portion extending through said forward surface of said first plate and an enlarged portion extending rearward from said small portion with a shoulder formed between said small portion and said enlarged portion, said enlarged portion of each aperture having side wall means extending rearward from said shoulder to a rear wall defined by said second plate, an electrical contact located partially in each of said apertures, each contact having a forward end portion and an enlarged rear end portion with said forward end portion extending through said small portion of its associated aperture and beyond said forward surface of said first plate and with said enlarged rear end portion located in the enlarged portion of its associated aperture, said enlarged rear end portion of each contact having means adapted to engage said shoulder of its associated aperture, said enlarged portion of each of said apertures having a length sufficient to allow said enlarged rear end portion of its associated contact to move rearward and forward therein, an electrically conductive coiled spring located in each enlarged porion of said apertures for urging said means of said enlarged rear end portion of its associated contact toward said shoulder and said forward end portion of its associated contact beyond said forward surface of said first plate, each coiled spring having a forward end tightly engaging said enlarged rear end portion of its associated contact and a rear end seated against said rear wall of said enlarged portion of its associated aperture.

3. A device for electrically contacting a plurality of spaced contact means located inward of the surface of a base member, comprising:

plate means comprising first and second plates secured together, said first plate being formed of electrically conductive material, said second plate being formed of electrically non-conductive material, an electrically conductive layer sandwiched between said first and second plates, said first plate having a forward surface, a plurality of spaced apart apertures formed in said first plate and extending through said forward surface of said first plate, each aperture comprising a small portion extending through said forward surface of said first plate and an enlarged portion extending rearward from said small portion with a shoulder formed between said small portion and said enlarged portion, said enlarged portion of each aperture having side wall means extending rearward from said shoulder to a rear wall defined by said electrically conductive layer, an electrical contact located partially in each of said apertures, each contact having a formed end portion and an enlarged rear end portion with said forward end portion extending through said small portion of its associated aperture and beyond said forward surface of said first plate and with said enlarged rear end portion located in the enlarged portion of its associated aperture, said enlarged rear end portion of each contact having means adapted to engage said shoulder of its associated aperture, said enlarged portion of each of said apertures having a length sufficient to allow said enlarged rear end portion of its associated contact to move rearward and forward therein.

an electrically conductive coiled spring located in each enlarged portion of said apertures for urging said means of said enlarged rear end portion of its associated contact toward said shoulder and said forward end portion of its associated contact beyond said forward surface of said first plate, each coiled spring having a forward end tightly engaging said enlarged rear end portion of its associated contact and a rear end seated against said rear wall of said enlarged portion of its associated aperture.

4. A device for electrically contacting a plurality of spaced contact means located inward of the surface of a base member, comprising:

forward and rear electrically non-conductive layers secured together, said forward layer having a forward surface, a plurality of spaced apart apertures formed through said forward layer, a plurality of electrically conductive housings located between said forward and rear layers, each of said housings having an opening in alignment with one of said apertures respectively, each housing being defined by a side wall means extending rearward from said forward layer to a rear wall, each of said openings of said housings having a cross sectional area greater than the cross sectional area of its associated aperture such that a shoulder is defined on the rear side of said forward layer between said aperture and said side wall means of said housing, an electrical contact located partially in each of said housings, each contact having a forward end portion and an enlarged rear end portion with said forward end portion extending through its associated aperture and beyond said forward surface of said forward layer and with said rear end portion located in said opening of its associated housing, said rear end portion of each contact having means adapted to engage said shoulder associated with its housing, each of said openings of said housings having a length sufficient to allow said rear end portion of its associated contact to move rearward and forward therein, an electrically conductive coiled spring located in each of said openings of said housings for urging said means of its associated contact toward said shoulder and said forward end portion of its associated contact beyond said forward surface of said forward layer, each coiled spring having a forward end tightly engaging said enlarged rear end portion of its associated contact and a rear end seated against said rear wall of its associated housing, each housing having a rear portion extending through said rear layer, and means for electrically connecting together said rear portions of said housings.

5. A device for electrically contacting a plurality of spaced contact means located inward of the surface of a base member, comprising:

forward and rear electrically non-conductive layers secured together, said forward layer having an outward facing forward surface, a plurality of spaced apart apertures formed through said forward layer, a plurality of spaced apart electrically conductive housings located between said forward and rear layers, said housings having openings in alignment with said apertures respectively formed through said forward layer, said openings of said housings being larger than said apertures formed through said forward layer such that a shoulder is formed on the rear surface of said forward layer between each aperture and the opening of its associated housing, each housing being defined by a side wall means extending rearward from said forward layer to a rear wall, an electrical contact located in each aperture and in the opening of its associated housing, each contact having a forward end portion and a rear end portion with said forward end portion extending through its associated aperture and beyond said forward surface of said forward layer and with said rear end portion located in the opening of its associated housing, said rear end portion of each contact having a diameter greater than that of its forward end portion, said rear end portion of each contact having means adapted to engage its associated shoulder formed on said rear surface of said forward layer, each of said openings of said housings having a length sufficient to allow said rear end portion of its associated contact to move rearward and forward therein when said means of said rear end portion of each contact engages its associated shoulder formed on said rear surface of said forward layer, said rear end portion of said contact is spaced from said rear wall of its associated housing, an electrically conductive coiled spring located in each opening of said housings for urging said means of said rear end portion of its associated contact toward its associated shoulder formed on said rear surface of said forward layer and said forward end portion of its associated contact beyond said forward surface of said forward layer, each coiled spring having a forward end surrounding and tightly engaging said rear end portion of its associated contact and a rear end seated against the rear wall of its associated housing and tightly engaging said side wall means of its associated housing, each coiled spring urging said rear end portion of its associated contact away from said rear wall of its associated housing, each housing having a rear portion extending through said rear layer, and means for electrically connecting together said rear portions of said housings.

* * * * *